US012563341B2

(12) United States Patent
Lan et al.

(10) Patent No.: US 12,563,341 B2
(45) Date of Patent: Feb. 24, 2026

(54) TRANSDUCER PROTECTION SYSTEM AND METHOD

(71) Applicant: AAC Technologies (Nanjing) Co., Ltd., Nanjing (CN)

(72) Inventors: Ruizhi Lan, Nanjing (CN); Lijian Ye, Nanjing (CN); Hongling Fu, Nanjing (CN); Yuheng Jiang, Nanjing (CN); Kejia Liu, Nanjing (CN)

(73) Assignee: AAC Technologies (Nanjing) Co., Ltd., Nanjing (CN)

( * ) Notice: Subject to any disclaimer, the term of this patent is extended or adjusted under 35 U.S.C. 154(b) by 168 days.

(21) Appl. No.: 18/544,351

(22) Filed: Dec. 18, 2023

(65) Prior Publication Data

US 2024/0340583 A1 Oct. 10, 2024

Related U.S. Application Data

(63) Continuation of application No. PCT/CN2023/086256, filed on Apr. 4, 2023.

(51) Int. Cl.
*H04R 3/00* (2006.01)
*H03F 3/20* (2006.01)
*H03G 1/00* (2006.01)

(52) U.S. Cl.
CPC .............. *H04R 3/007* (2013.01); *H03F 3/20* (2013.01); *H03G 1/0005* (2013.01); *H03F 2200/03* (2013.01)

(58) Field of Classification Search
CPC ............ H04R 3/007; H03F 3/20; H03G 1/005
See application file for complete search history.

(56) References Cited

U.S. PATENT DOCUMENTS

| 10,165,361 B2 * | 12/2018 | Thyssen | ................. H04R 3/007 |
| 2011/0228945 A1 * | 9/2011 | Mihelich | .............. H04R 29/001 |
| | | | 381/59 |

* cited by examiner

*Primary Examiner* — Olisa Anwah
(74) *Attorney, Agent, or Firm* — Wiersch Law Group

(57) ABSTRACT

The present invention provides a transducer protection system and method. A transducer module at least comprises a transducer, and a signal source is used for generating a first signal; a protection module is used for predicting an actual displacement and/or temperature of the transducer according to the first signal, an amplification factor of the power amplifier and built-in transducer parameters to generate a prediction result, comparing the prediction result with a preset value to generate an analysis result, and regulating the first signal to form a second signal according to the analysis result; a power amplifier is used for receiving the second signal, and performing power amplification on the second signal to form a driving signal; and the transducer module is used for receiving the driving signal, and at least one transducer in the transducer module can work according to the driving signal.

7 Claims, 3 Drawing Sheets

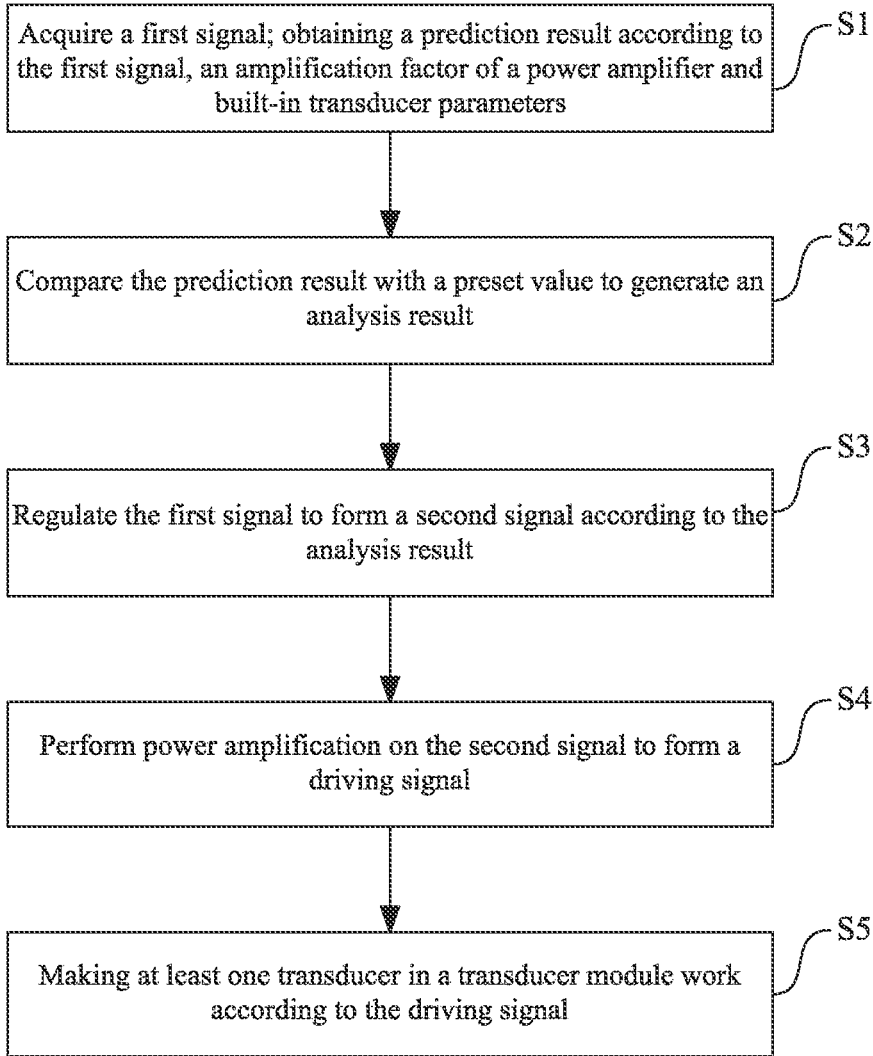

Acquire a first signal; obtaining a prediction result according to the first signal, an amplification factor of a power amplifier and built-in transducer parameters ⟋ S1

Compare the prediction result with a preset value to generate an analysis result ⟋ S2

Regulate the first signal to form a second signal according to the analysis result ⟋ S3

Perform power amplification on the second signal to form a driving signal ⟋ S4

Making at least one transducer in a transducer module work according to the driving signal ⟋ S5

Fig. 4

TRANSDUCER PROTECTION SYSTEM AND METHOD

TECHNICAL FIELD

The present application relates to the technical field of transducer protection, in particular to a transducer protection system and method.

BACKGROUND

The increasing use of electronic devices with mobile communication functions, such as portable phones, personal digital assistants, laptops and tablets, has led to increasingly higher demands for functionality in these devices. As a result, a growing number of components need to be incorporated into these devices. Conventional electronic devices generally comprise transducers. In situations where overall space is limited, some electronic devices integrate a tweeter and a woofer of the transducer to form a coaxial speaker, or integrate a speaker and a linear motor to form a composite transducer, thus reducing device size and improving space utilization while enhancing performance. In practical applications, to save costs, a single power amplifier is often used for driving a composite transducer that integrates multiple transducers. In this usage scenario, traditional transducer protection modules cannot function properly, leading to ineffective protection for the transducer.

Therefore, it is necessary to provide a transducer protection system and method to address the above issue.

SUMMARY

The present invention aims to provide a transducer protection system and method to address the problem in the related art where a single power amplifier is often used for driving a composite transducer that integrates multiple transducers, in which case traditional transducer protection modules cannot function properly, leading to ineffective protection for the transducer.

The technical solutions of the present invention are as follows. A first aspect of the present invention provides a transducer protection system. The transducer protection system comprises a signal source, a protection module, a power amplifier and a transducer module which are connected in sequence, wherein the transducer module at least comprises a transducer, and the signal source is used for generating a first signal; the protection module is used for predicting an actual displacement and/or temperature of the transducer according to the first signal, an amplification factor of the power amplifier and built-in transducer parameters to generate a prediction result, comparing the prediction result with a preset value to generate an analysis result, and regulating the first signal to form a second signal according to the analysis result; the power amplifier is used for receiving the second signal, and performing power amplification on the second signal to form a driving signal; and the transducer module is used for receiving the driving signal, and at least one transducer in the transducer module can work according to the driving signal.

In one possible design, the transducer protection system further comprises a first feedback module; and the first feedback module is used for collecting a first voltage and current signal at an output end of the power amplifier and feeding the first voltage and current signal back to the protection module.

In one possible design, the transducer protection system further comprises at least one second feedback module; and the second feedback module is used for collecting second voltage and current signals at two ends of the transducer and feeding the second voltage and current signals back to the protection module.

In one possible design, the transducer protection system further comprises a peripheral circuit; the power amplifier is connected with the transducer module through the peripheral circuit; and the peripheral circuit is used for processing the driving signal to form at least one sub-driving signal, and inputting the sub-driving signals into the corresponding transducers.

In one possible design, the transducer is a combination of one or more of a speaker, a receiver and a linear motor unit.

A second aspect of the present invention provides a transducer protection method, comprising:

acquiring a first signal; obtaining a prediction result according to the first signal, an amplification factor of a power amplifier and built-in transducer parameters;

comparing the prediction result with a preset value to generate an analysis result;

regulating the first signal to form a second signal according to the analysis result;

performing power amplification on the second signal to form a driving signal; and making at least one transducer in a transducer module work according to the driving signal.

In one possible design, the step of obtaining a prediction result according to the first signal, an amplification factor of a power amplifier and built-in transducer parameters specifically comprises:

obtaining a predicted voltage applied to the transducer according to the first signal and the amplification factor; and obtaining the prediction result according to the predicted voltage and the built-in transducer parameters.

In one possible design, the step of obtaining a prediction result according to the first signal, an amplification factor of a power amplifier and built-in transducer parameters further comprises:

acquiring a first voltage and current signal at an output end of the power amplifier;

obtaining real-time parameters of the transducer according to the first voltage and current signal; and correcting the prediction result according to the real-time parameters.

In one possible design, the step of obtaining a prediction result according to the first signal, an amplification factor of a power amplifier and built-in transducer parameters further comprises:

acquiring second voltage and current signals at two ends of the transducer;

obtaining real-time parameters of the transducer according to the second voltage and current signals; and correcting the prediction result according to the real-time parameters.

In one possible design, the step of making at least one transducer in a transducer module work according to the driving signal specifically comprises:

processing the driving signal to form at least one sub-driving signal, and inputting the sub-driving signals into the corresponding transducers to drive the corresponding transducers to work.

The beneficial effects of the present invention are as follows. After the signal source generates the first signal, the protection module can predict the actual displacement and/ or temperature of each transducer in the transducer module based on the first signal, the amplification factor of the power amplifier, and the built-in transducer parameters to generate the prediction result, compare the prediction result with the preset value (maximum displacement and/or highest temperature designed for each transducer) to generate the corresponding analysis result, and regulate the first signal based on the analysis result (for example, through compression regulation) to form the second signal. At this point, the power amplifier can receive the second signal and perform power amplification on the second signal to form the driving signal which drives the transducers in the transducer module to work. The protection module can prevent excessive power of the driving signal generated by the power amplifier to ensure that the transducers in the transducer module remain within their designated operational limits, such as maximum displacement and/or highest temperature, thereby realizing reliable operation of the transducers and improving the conversion power and service life of the transducers.

It should be understood that the above general description and the following detailed description are only exemplary, and do not limit the application.

BRIEF DESCRIPTION OF DRAWINGS

FIG. 4 is a flow diagram of a transducer protection method according to one embodiment of the present invention.

Figure 1:
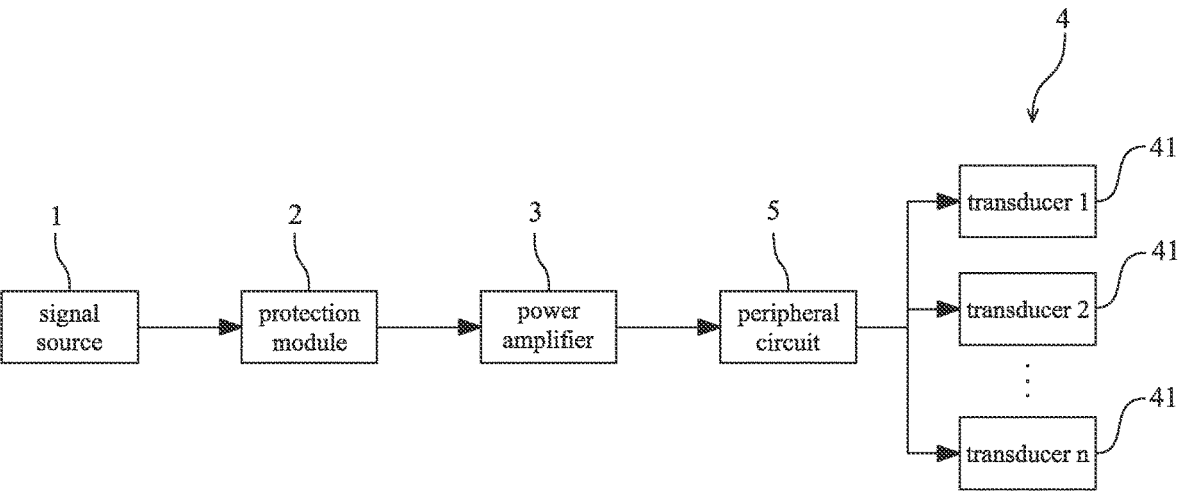
FIG. 1 is a structural block diagram of a transducer protection system according to one embodiment of the present invention.

List of reference numerals: 1—signal source; 2—protection module; 3—power amplifier; 4—transducer module; 41—transducer; 5—peripheral circuit; 6—first feedback module; 7—second feedback module.

The accompanying drawings, which are incorporated in and constitute a part of this specification, illustrate embodiments consistent with the present application and together with the specification, serve to explain the principles of the present application.

DETAILED DESCRIPTION OF EMBODIMENTS

The present invention will be further described below with reference to the accompanying drawings and embodiments.

Terms used in the embodiments of the present invention are for the purpose of describing specific embodiments only, and are not intended to limit the present application. As used in the embodiments of the present invention and the appended claims, the singular forms "a", "said" and "the" are also intended to include the plural forms, unless the context clearly indicates other meanings.

It should be understood that the term "and/or" herein signifies an association relationship between associated objects, denoting the possibility of three different relationship types. For example, A and/or B may mean A alone; A and B; and B alone. In addition, the character "/" herein generally indicates that the associated objects have an "or" relationship.

It should be noted that the directional words such as "above", "below", "left" and "right" described in the embodiments of the present application are described from the angle shown in the attached drawings, and should not be understood as limitations to the embodiments of the present application. In addition, in this context, it should be understood that when an element is mentioned as being connected to another element ("above" or "below"), it means that the element can be directly connected to the other element ("above" or "below") or indirectly connected through an intermediate element.

Figure 2:
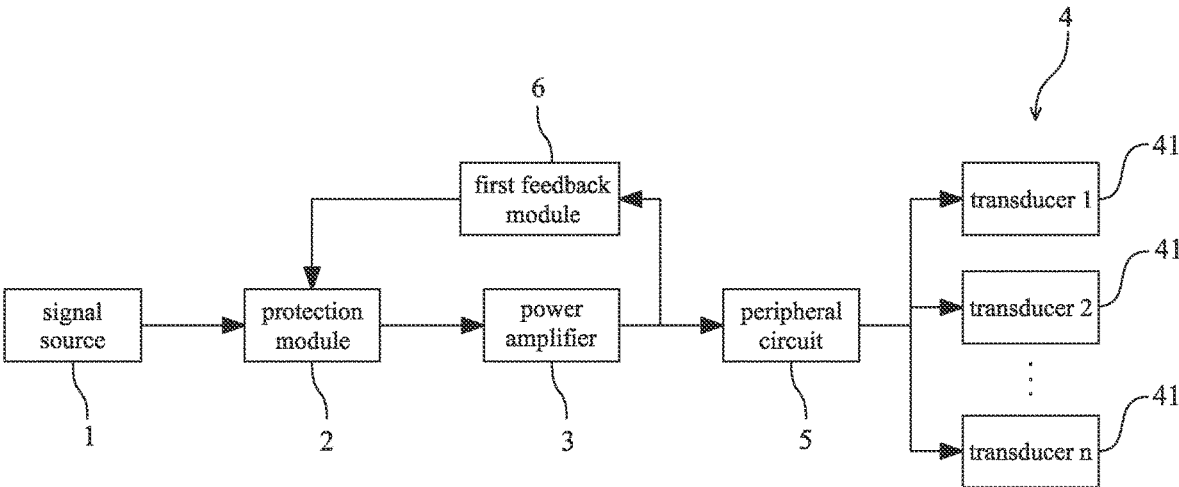
FIG. 2 is a structural block diagram of a transducer protection system according to another embodiment of the present invention in another embodiment.
Figure 3:
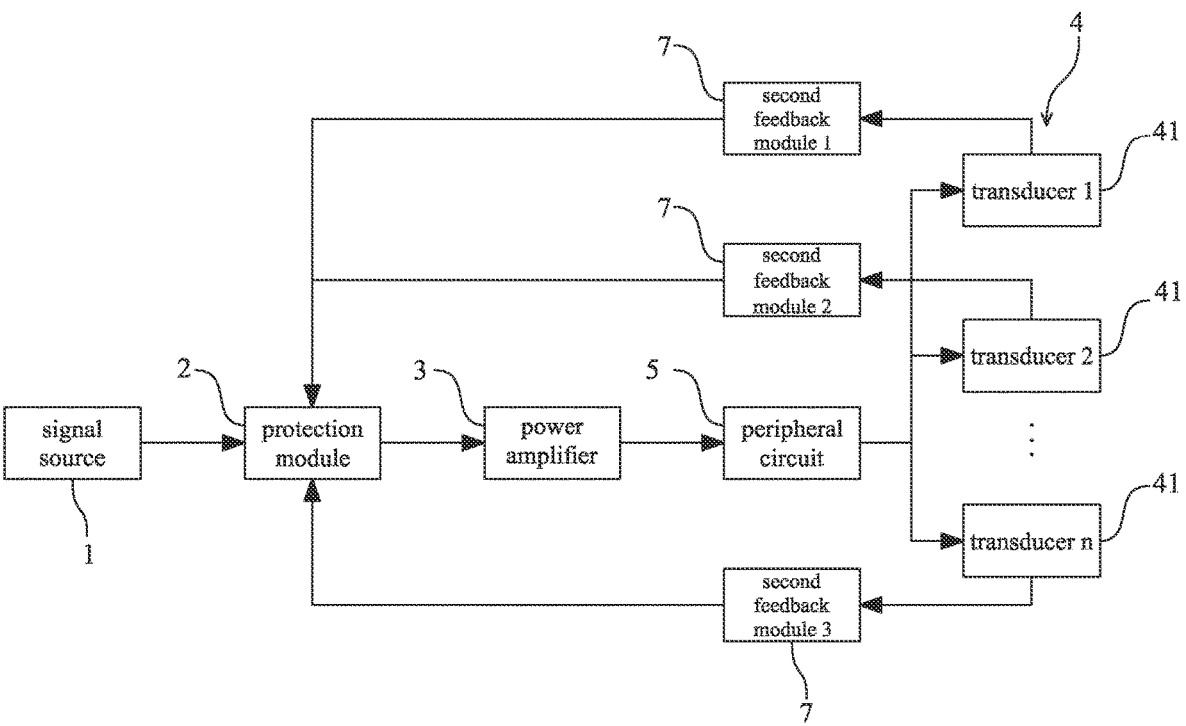
FIG. 3 is a structural block diagram of a transducer protection system according to one embodiment of the present invention.

A first aspect of the present invention provides a transducer protection system. As shown in FIGS. 1-3, the transducer protection system comprises a signal source 1, a protection module 2, a power amplifier 3 and a transducer module 4 which are connected in sequence, wherein the transducer module 4 at least comprises a transducer 41, and the signal source 1 is used for generating a first signal; the protection module 2 is used for predicting an actual displacement and/or temperature of the transducer 41 according to the first signal, an amplification factor of the power amplifier 3 and built-in transducer parameters to generate a prediction result, comparing the prediction result with a preset value to generate an analysis result, and regulating the first signal to form a second signal according to the analysis result; the power amplifier 3 is used for receiving the second signal, and performing power amplification on the second signal to form a driving signal; and the transducer module 4 is used for receiving the driving signal, and at least one transducer 41 in the transducer module 4 can work according to the driving signal.

In this embodiment, as shown in FIGS. 1-3, after the signal source 1 generates the first signal, the protection module 2 can predict the actual displacement and/or temperature of each transducer 41 in the transducer module 4 based on the first signal, the amplification factor of the power amplifier 3, and the built-in transducer parameters to generate the prediction result, compare the prediction result with the preset value (maximum displacement and/or highest temperature designed for each transducer 41) to generate the corresponding analysis result, and regulate the first signal based on the analysis result (for example, through compression regulation) to form the second signal. At this point, the power amplifier 3 can receive the second signal and perform power amplification on the second signal to form the driving signal which drives the transducers 41 in the transducer module 4 to work. The protection module 2 can prevent excessive power of the driving signal generated by the power amplifier 3 to ensure that the transducers 41 in the transducer module 4 remain within their designated operational limits, such as maximum displacement and/or highest temperature, thereby realizing reliable operation of the transducers 41 and improving the conversion power and service life of the transducers 41.

The first signal generated by the signal source 1 is an original audio signal, which can be a digital signal or an analog signal, which is not limited here.

The power amplifier 3, which can be a power amplifier chip or other types of power amplifiers, can perform power amplification on the second signal to improve the performance of the transducer 41. When a power amplifier chip serves as the power amplifier 3, commonly known as a digital power amplifier, digital-to-analog conversion and amplification can be directly performed on digital signals, which has the advantages of simple structure, high efficiency, less sound quality damage, low cost, etc. In addition, when the power amplifier 3 is a power amplifier chip, the second signal obtained after regulation by the protection module 2 needs to be a digital signal. The power amplifier 3 can also be specifically set according to application requirements, such as setting the amplification factor, so that its driving force can meet the application requirements of different transducers 41. The specific form of the power amplifier 3 is not limited here.

The protection module 2 mainly refers to a hardware device carrying relevant protection algorithms, which can be a central processing unit (CPU), a digital signal processor (DSP), a codec designed in a circuit (such as peripheral circuit 5), or a hardware device designed on the power amplifier 3 which can run the algorithms (such as DSP). The specific form of the protection module 2 is not limited here. The amplification factor of the power amplifier and the transducer parameters can be input into the protection module 2 in advance for easy retrieval and use.

According to the specific structure of the transducer protection system, the protection algorithm in the protection module 2 can be a feedback-free algorithm as shown in FIG. 1 or a feedback algorithm as shown in FIGS. 2-3. Specific embodiments will be provided below for further explanation.

In a first specific embodiment, as shown in FIG. 1, the transducer protection system is not provided with a feedback module, and the protection module 2 can directly obtain a predicted voltage expected to be applied to the transducer 41 according to the first signal and the amplification factor of the power amplifier 3, then predict the actual displacement and/or temperature of each transducer 41 in the transducer module 4 according to the predicted voltage and the built-in transducer parameters to generate a prediction result, then compare the prediction result with a preset value (maximum displacement and/or highest temperature designed for each transducer 41) to generate a corresponding analysis result, and then perform compression regulation on the first signal according to the analysis result to form a second signal, so as to ensure that the transducers 41 in the transducer module 4 remain within their designated maximum displacement and/or highest temperature during operation. This structure is simple and easy to realize, and the transducers 41 can be well protected.

In a second specific embodiment, as shown in FIG. 2, the transducer protection system further comprises a first feedback module 6; and the first feedback module 6 is used for collecting a first voltage and current signal at an output end of the power amplifier 3 and feeding the first voltage and current signal back to the protection module 2.

During the operation of the transducer 41, the temperature of the transducer 41 will rise, and some parameters of the transducer 41, such as resistance, will change during the temperature rise of the transducer 41. Thus, when the protection module 2 predicts the actual displacement and/or temperature of the transformer 41, errors may occur.

In this embodiment, as shown in FIG. 2, the first feedback module 6 can feed the first voltage and current signal at the output end of the power amplifier 3 back to the protection module 2 during the operation of the transducer 41, and the protection module 2 can calculate the real-time parameters of the transducer, such as real-time resistance values, which may change during the working process of the transformer 41, according to the first voltage and current signal, the built-in transducer parameters and ground circuit information (such as capacitance, inductance and connection mode). This allows for real-time correction of the predicted displacement and/or temperature, reducing prediction errors and improving the accuracy of prediction results. It also enhances the preparedness of the protection module 2 for regulating the first signal, ensures that the transformers 41 in the transformer module 4 remain within their designated operational limits, and guarantees the operation reliability of the transformer. The transformer protection system with the feedback module only requires one first feedback module 6 to achieve real-time correction of the predicted displacement and/or temperature, making the structure simple and cost-effective.

In the specific embodiment shown in FIG. 2, the first feedback module 6 can be a sensor or other devices that can collect and feed back voltage and current information. In another implementation, the first feedback module 6 can be integrated with the power amplifier 3 into a chip with the functions of power amplification, digital-to-analog conversion, voltage and current feedback, etc. The specific form of the peripheral circuit 5 is not limited here.

In a third specific embodiment, as shown in FIG. 3, the transducer protection system further comprises at least one second feedback module 7, which is used for collecting second voltage and current signals at two ends of the transducer 41 and feeding the second voltage and current signals back to the protection module 2.

In this embodiment, as shown in FIG. 3, each second feedback module 7 can feed the second voltage and current information at two ends of each transducer back to the protection module 2 during the operation of each transducer 41, and the protection module 2 can calculate the real-time parameters of the corresponding transducer 41, such as real-time resistance values, which may change during the working process of the transformer 41, according to the corresponding second voltage and current information. This allows for real-time correction of the predicted displacement and/or temperature, reducing prediction errors. Moreover, because the second feedback module 7 directly feeds back the voltage and current information of each transducer 41, indirect calculation based on circuit information is eliminated for the protection module 2, which further improves the accuracy of prediction results. It also enhances the preparedness of the protection module 2 for regulating the first signal, ensures that the transformers 41 in the transformer module 4 remain within their designated operational limits, guarantees the operation reliability of the transformer, and prolongs the service life of the transformer 41.

In the specific embodiment shown in FIG. 2, the second feedback module 7 can be a sensor or other devices that can collect and feed back voltage and current information, and the specific number of the second feedback modules 7 corresponds to the number of the transducers 41.

In addition, the first feedback module 6 and the second feedback module 7 can be used separately or in combination. The specific usage scheme can be determined based on the specific design of the transducer protection system (such as the number of transducers 41 in the transducer module 4, the design of the power amplifier 3, and the actual usage cost).

It should be noted that different transducers 41 have different parameters, which can be determined based on how the transducer 41 is actually configured in the protection module 2. For example, taking the transducer 41 as a speaker or a motor, the transducer parameters include but are not limited to electro-mechanical coupling factor (BL), elastic coefficient (Km), resistance (Re), inductance (Le), damping (Rm), and other related parameters. If the transducer 41 is a composite transducer composed of two individual transducers, the transducer parameters should include all the parameters of the two individual transducers.

In a specific embodiment, as shown in FIGS. 1-3, the transducer 41 is a combination of one or more of a speaker, a receiver and a linear motor unit.

In this embodiment, as shown in FIGS. 1-3, according to functional requirements for different electronic devices, the transducer 41 in the transducer protection system can be a speaker, a receiver, a linear motor unit, etc. Here, the speaker can be a common moving-coil speaker or a coaxial speaker integrating a tweeter and a woofer, and the linear motor can be a Z-axis linear motor or an X-axis linear motor. In addition, different transducers 41 can be combined in series or in parallel, or they can be integrated as one unit, for example, a two-in-one composite transducer 41 that integrates a receiver and a speaker. In this way, the integration of electronic devices can be improved, material and labor costs can be reduced, and higher usage requirements for electronic devices can be met.

Of course, the transducer 41 can also be other devices, which is not limited here.

In a specific embodiment, as shown in FIGS. 1-3, the transducer protection system further comprises a peripheral circuit 5; the power amplifier 3 is connected with the transducer module 4 through the peripheral circuit 5; and the peripheral circuit 5 is used for processing the driving signal to form at least one sub-driving signal, and inputting the sub-driving signals into the corresponding transducers 41.

The peripheral circuit 5 can have various functions according to design requirements, for example, it can be used as a control circuit, a protection circuit, or a filter circuit.

In this embodiment, as shown in FIGS. 1-3, the peripheral circuit 5, together with the transducers, serves as the load for the power amplifier 3. The peripheral circuit 5 can process the driving signal output by the power amplifier 3 to form sub-driving signals corresponding to each transducer 41, and input the sub-driving signals to the corresponding transducers 41. In this way, it is ensured that the sub-driving signals actually applied to the two ends of each transducer 41 are the desired driving signals, thereby improving the operational efficiency and effectiveness of the transducer 41.

In a specific embodiment, the peripheral circuit 5 can be a passive circuit, specifically, a frequency dividing circuit composed of passive components such as a capacitor, an inductor and a resistor, which divides a voltage output by the power amplifier 3 and applies it to different transducers 41. The peripheral circuit 5 can also be used for directly connecting different transducers 41 in series or parallel to two ends of an output circuit of the power amplifier 3.

Of course, depending on the specific application needs of driving multiple transducers 41 with a single power amplifier 3, additional designs can be implemented for the peripheral circuit 5. For example, the peripheral circuit 5 can also be an active circuit comprising both passive components and active components (such as bipolar transistors, unipolar transistors, and integrated operational amplifiers). The peripheral circuit 5 can process analog signals as well as digital signals, which is not limited here.

A second aspect of the present invention provides a transducer protection method. As shown in FIG. 4, the transducer protection method comprises the following steps.

In S1, a first signal is acquired, and a prediction result is obtained according to the first signal, an amplification factor of a power amplifier 3 and built-in transducer 41 parameters.

In this step, the first signal generated by a signal source 1 is an original audio signal, which can be a digital signal or an analog signal. The amplification factor of the power amplifier and the transducer parameters can be input into a protection module 2 in advance for easy retrieval and use, so that the protection module 2 can predict the actual displacement and/or temperature of each transducer 41 in a transducer module 4 to generate a prediction result.

In S2, the prediction result is compared with a preset value to generate an analysis result.

In this step, the preset value is the maximum displacement and/or highest temperature or other parameters designed for each transducer 41. The predicted result is compared with the preset value to analyze whether the actual displacement and/or temperature of the transducer 41 is within the normal range.

In S3, the first signal is regulated to form a second signal according to the analysis result.

In this step, if the analysis result shows that the actual displacement and/or temperature of the transducer 41 exceeds the preset value, the protection module 2 can perform compression regulation on the input first signal according to the actual analysis result to form the second signal.

In S4, power amplification is performed on the second signal to form a driving signal.

In this step, the power amplifier 3 can receive the second signal and perform power amplification on the second signal to form the driving signal, so as to drive each transducer 41 in the transducer module 4 to work.

In S5, at least one transducer 41 in the transducer module 4 works according to the driving signal.

In this step, the transducer module 4 can receive the driving signal, and at least one transducer 41 in the transducer module 4 is capable of working according to the driving signal.

In this embodiment, as shown in FIG. 4 as well as FIGS. 1-3, after the signal source 1 generates the first signal, the protection module 2 can predict the actual displacement and/or temperature of each transducer 41 in the transducer module 4 based on the first signal, the amplification factor of the power amplifier 3, and the built-in transducer parameters to generate the prediction result, compare the prediction result with the preset value (maximum displacement and/or highest temperature designed for each transducer 41) to generate the corresponding analysis result, and regulate the first signal based on the analysis result (for example, through compression regulation) to form the second signal. At this point, the power amplifier 3 can receive the second signal and perform power amplification on the second signal to form the driving signal which drives the transducers 41 in the transducer module 4 to work. The protection module 2 can prevent excessive power of the driving signal generated by the power amplifier 3 to ensure that the transducers 41 in the transducer module 4 remain within their designated operational limits, such as maximum displacement and/or highest temperature, thus keeping the transducers 41 in the best working condition and improving their conversion power and service life.

The first signal generated by the signal source 1 is an original audio signal, which can be a digital signal or an analog signal, which is not limited here.

The power amplifier 3, which can be a power amplifier chip or other types of power amplifiers, can perform power amplification on the second signal, so as to improve the performance of the transducer 41. When a power amplifier chip serves as the power amplifier 3, commonly known as a digital power amplifier, digital-to-analog conversion and amplification can be directly performed on digital signals, which has the advantages of simple structure, high efficiency, less sound quality damage, low cost, etc. In addition, when the power amplifier 3 is a power amplifier chip, the second signal obtained after regulation by the protection module 2 needs to be a digital signal. The power amplifier 3 can also be specifically set according to application requirements, such as setting the amplification factor, so that its driving force can meet the application requirements of different transducers 41. The specific form of the power amplifier 3 is not limited here.

The protection module 2 mainly refers to a hardware device carrying relevant protection algorithms, which can be a central processing unit (CPU), a digital signal processor (DSP), a codec designed in a circuit (such as peripheral circuit 5), or a hardware device designed on the power amplifier 3 which can run the algorithms (such as DSP). The specific form of the protection module 2 is not limited here. The amplification factor of the power amplifier and the transducer parameters can be input into the protection module 2 in advance for easy retrieval and use.

According to the specific structure of the transducer protection system, the protection algorithm in the protection module 2 can be a feedback-free algorithm as shown in FIG. 1 or a feedback algorithm as shown in FIGS. 2-3. Specific embodiments will be provided below for further explanation.

In a first specific embodiment, as shown in FIG. 1, the transducer protection system is provided with no feedback module. In a first specific embodiment, the step of obtaining a prediction result according to the first signal, an amplification factor of a power amplifier 3 and built-in transducer parameters specifically comprises the following steps.

In S11, a predicted voltage applied to the transducer 41 is obtained according to the first signal and the amplification factor.

In this step, the protection module 2 can directly obtain the predicted voltage expected to be applied to the transducer 41 according to the first signal and the amplification factor of the power amplifier 3.

In S12, the prediction result is obtained according to the predicted voltage and the built-in transducer parameters.

In this step, the protection module 2 can predict the actual displacement and/or temperature of each transducer 41 in the transducer module 4 according to the predicted voltage and the built-in transducer parameters, so as to generate the prediction result.

In this embodiment, as shown in FIG. 1, the transducer protection system is not provided with a feedback module, and the protection module 2 can directly obtain a predicted voltage to be applied to the transducer 41 according to the first signal and the amplification factor of the power amplifier 3, then predict the actual displacement and/or temperature of each transducer 41 in the transducer module 4 according to the predicted voltage and the built-in transducer parameters to generate a prediction result, then compare the prediction result with a preset value (maximum displacement and/or highest temperature designed for each transducer 41) to generate a corresponding analysis result, and then perform compression regulation on the first signal according to the analysis result to form a second signal, so as to ensure that the transducers 41 in the transducer module 4 remain within their designated maximum displacement and/or highest temperature during operation. This structure is simple and easy to realize, and the transducers 41 can be well protected.

In a second specific embodiment, as shown in FIG. 2, the transducer protection system further comprises a first feedback module 6, and on the basis of steps S11 and S12, the step of obtaining a prediction result according to the first signal, an amplification factor of a power amplifier 3 and built-in transducer parameters further comprises the following steps.

In S13, a first voltage and current signal at an output end of the power amplifier 3 is acquired.

In this step, the first feedback module 6 collects the first voltage and current signal at the output end of the power amplifier 3 and feeds the first voltage and current signal back to the protection module 2, so that the protection module 2 can obtain the first voltage and current signal at the output end of the power amplifier 3.

In S14, real-time parameters of the transducer 41 are obtained according to the first voltage and current signal.

In this step, the real-time parameters of the transducer, such as real-time resistance values, which may change during the working process of the transformer 41, are calculated according to the first voltage and current signal, the built-in transducer parameters and ground circuit information (such as capacitance, inductance and connection mode).

In S15, the prediction result is corrected according to the real-time parameters.

In this step, the predicted displacement and/or temperature can be corrected in real time according to the obtained real-time parameters, so as to achieve the purpose of correcting the predicted result.

In this embodiment, as shown in FIG. 2, the first feedback module 6 can feed the first voltage and current signal at the output end of the power amplifier 3 back to the protection module 2 during the operation of the transducer 41, and the protection module 2 can calculate the real-time parameters of the transducer, such as real-time resistance values, which may change during the working process of the transformer 41, according to the first voltage and current signal, the built-in transducer parameters and ground circuit information (such as capacitance, inductance and connection mode). This allows for real-time correction of the predicted displacement and/or temperature, reducing prediction errors and improving the accuracy of prediction results. It also enhances the preparedness of the protection module 2 for regulating the first signal, ensures that the transformers 41 in the transformer module 4 remain within their designated operational limits, and guarantees the operation reliability of the transformer. The transformer protection system with the feedback module only requires one first feedback module 6 to achieve real-time correction of the predicted displacement and/or temperature, making the structure simple and cost-effective.

In the specific embodiment shown in FIG. 2, the first feedback module 6 can be a sensor or the like that can collect and feed back voltage and current information. In another implementation, the first feedback module 6 can be integrated with the power amplifier 3 into a chip with the functions of power amplification, digital-to-analog conversion, voltage and current feedback, etc. The specific form of the peripheral circuit 5 is not limited here.

In a third specific embodiment, as shown in FIG. 3, the transducer protection system further comprises at least one second feedback module 7, and on the basis of steps S11 and S12, the step of obtaining a prediction result according to the first signal, an amplification factor of a power amplifier 3 and built-in transducer 41 parameters further comprises the following steps.

In S16, second voltage and current signals at two ends of the transducer 41 are acquired.

In this step, the second feedback module 7 collects the second voltage and current signals at two ends of the transducer 41 and feeds the second voltage and current signals back to the protection module 2, so that the protection module 2 can obtain the second voltage and current signals at two ends of the transducer 41.

In S17, real-time parameters of the transducer 41 are obtained according to the second voltage and current signals.

In this step, the protection module 2 can calculate the real-time parameters of the corresponding transducer 41, such as real-time resistance values, which may change during the working process of the transformer 41, according to the corresponding second voltage and current information.

In S18, the prediction result is corrected according to the real-time parameters.

In this step, the predicted displacement and/or temperature can be corrected in real time according to the obtained real-time parameters, so as to achieve the purpose of correcting the predicted result.

In this embodiment, as shown in FIG. 3, each second feedback module 7 can feed the second voltage and current information at two ends of each transducer back to the protection module 2 during the operation of each transducer 41, and the protection module 2 can calculate the real-time parameters of the corresponding transducer 41, such as real-time resistance values, which may change during the working process of the transformer 41, according to the corresponding second voltage and current information. This allows for real-time correction of the predicted displacement and/or temperature, reducing prediction errors. Moreover, because the second feedback module 7 directly feeds back the voltage and current information of each transducer 41, indirect calculation based on circuit information is eliminated for the protection module 2, which further improves the accuracy of prediction results. It also enhances the preparedness of the protection module 2 for regulating the first signal, ensures that the transformers 41 in the transformer module 4 remain within their designated operational limits, guarantees the operation reliability of the transformer, and prolongs the service life of the transformer 41.

In the specific embodiment shown in FIG. 2, the second feedback module 7 can be a sensor or the like that can collect and feed back voltage and current information, and the specific number of the second feedback modules 7 corresponds to the number of the transducers 41.

In addition, the first feedback module 6 and the second feedback module 7 can be used separately or in combination. The specific usage scheme can be determined based on the specific design of the transducer protection system (such as the number of transducers 41 in the transducer module 4, the design of the power amplifier 3, and the actual usage cost).

It should be noted that different transducers 41 have different parameters, which can be determined based on how the transducer 41 is actually configured in the protection module 2. For example, taking the transducer 41 as a speaker or a motor, the transducer parameters include but are not limited to electro-mechanical coupling factor (BL), elastic coefficient (Km), resistance (Re), inductance (Le), damping (Rm), and other related parameters. If the transducer 41 is a composite transducer composed of two individual transducers, then the transducer parameters should include all the parameters of the two individual transducers.

In a specific embodiment, as shown in FIGS. 1-3, the transducer 41 is a combination of one or more of a speaker, a receiver and a linear motor unit.

In this embodiment, as shown in FIGS. 1-3, according to functional requirements for different electronic devices, the transducer 41 in the transducer protection system can be a speaker, a receiver, a linear motor unit, etc. Here, the speaker can be a common moving-coil speaker or a coaxial speaker integrating a tweeter and a woofer, and the linear motor can be a Z-axis linear motor or an X-axis linear motor. In addition, different transducers 41 can be combined in series or in parallel, or they can be integrated as one unit, for example, a two-in-one composite transducer 41 that integrates a receiver and a speaker. This can improve the integration of electronic devices, reduce material and labor costs, and meet higher usage requirements for electronic devices.

Of course, the transducer 41 can also be other devices, which is not limited here.

In a specific embodiment, the step of making at least one transducer 41 in the transducer module 4 work according to the driving signal specifically comprises:

processing the driving signal to form at least one sub-driving signal, and inputting the sub-driving signals into the corresponding transducers 41 to drive the corresponding transducers 41 to work.

In this embodiment, as shown in FIGS. 1-3, the peripheral circuit 5, together with the transducers, serves as the load for the power amplifier 3. The peripheral circuit 5 can process the driving signal output by the power amplifier 3 to form sub-driving signals corresponding to each transducer 41, and input the sub-driving signals to the corresponding transducers 41. In this way, it is ensured that the sub-driving signals actually applied to the two ends of each transducer 41 are the desired driving signals, thereby improving the operational efficiency and effectiveness of the transducer 41.

In a specific embodiment, the peripheral circuit 5 can be a passive circuit, specifically, a frequency dividing circuit composed of passive components such as a capacitor, an inductor and a resistor, which divides a voltage output by the power amplifier 3 and applies it to different transducers 41. The peripheral circuit 5 can also be used for directly connecting different transducers 41 in series or parallel to two ends of an output circuit of the power amplifier 3.

Of course, depending on the specific application needs of driving multiple transducers 41 with a single power amplifier 3, additional designs can be implemented for the peripheral circuit 5. For example, the peripheral circuit 5 can also be an active circuit comprising both passive components and active components (such as bipolar transistors, unipolar transistors, and integrated operational amplifiers). The peripheral circuit 5 can process analog signals as well as digital signals, which is not limited here.

The above are only embodiments of the present invention, and it should be pointed out here that for those of ordinary skill in the art, improvements can be made without departing from the inventive concept of the present invention, and all these improvements belong to the protection scope of the present invention.

What is claimed is:

1. A transducer protection system, comprising a signal source, a protection module, a power amplifier and a transducer module which are connected in sequence, wherein the transducer module at least comprises a transducer;

the signal source is used for generating a first signal;

the protection module is used for predicting an actual displacement and/or temperature of the transducer according to the first signal, an amplification factor of the power amplifier and built-in transducer parameters to generate a prediction result, comparing the prediction result with a preset value to generate an analysis result, and regulating the first signal to form a second signal according to the analysis result;

the power amplifier is used for receiving the second signal, and performing power amplification on the second signal to form a driving signal; and the transducer module is used for receiving the driving signal, and at least one said transducer in the transducer module is capable of working according to the driving signal;

wherein the transducer protection system further comprises at least one second feedback module; and the second feedback module is used for collecting second voltage and current signals at two ends of the transducer and feeding the second voltage and current signals back to the protection module.

2. The transducer protection system according to claim 1, wherein the transducer protection system further comprises a first feedback module; and the first feedback module is used for collecting a first voltage and current signal at an output end of the power amplifier and feeding the first voltage and current signal back to the protection module.

3. The transducer protection system according to claim 1, wherein the transducer protection system further comprises a peripheral circuit;

the power amplifier is connected with the transducer module through the peripheral circuit; and the peripheral circuit is used for processing the driving signal to form at least one sub-driving signal, and inputting the sub-driving signals into the corresponding transducers.

4. The transducer protection system according to claim 1, wherein the transducer is a combination of one or more of a speaker, a receiver and a linear motor unit.

5. A transducer protection method, comprising:

acquiring a first signal; obtaining a prediction result according to the first signal, an amplification factor of a power amplifier and built-in transducer parameters;

comparing the prediction result with a preset value to generate an analysis result;

regulating the first signal to form a second signal according to the analysis result;

performing power amplification on the second signal to form a driving signal; and making at least one transducer in a transducer module work according to the driving signal;

wherein the step of obtaining a prediction result according to the first signal, an amplification factor of a power amplifier and built-in transducer parameters specifically comprises:

obtaining a predicted voltage applied to the transducer according to the first signal and the amplification factor; and obtaining the prediction result according to the predicted voltage and the built-in transducer parameters;

acquiring second voltage and current signals at two ends of the transducer;

obtaining real-time parameters of the transducer according to the second voltage and current signals; and correcting the prediction result according to the real-time parameters.

6. The transducer protection method according to claim 5, wherein the step of obtaining a prediction result according to the first signal, an amplification factor of a power amplifier and built-in transducer parameters further comprises:

acquiring a first voltage and current signal at an output end of the power amplifier;

obtaining real-time parameters of the transducer according to the first voltage and current signal; and correcting the prediction result according to the real-time parameters.

7. The transducer protection method according to claim 5, wherein the step of making at least one transducer in a transducer module work according to the driving signal specifically comprises:

processing the driving signal to form at least one sub-driving signal, and inputting the sub-driving signals into the corresponding transducers to drive the corresponding transducers to work.

* * * * *